(12) United States Patent
Takahashi et al.

(10) Patent No.: US 11,462,339 B2
(45) Date of Patent: Oct. 4, 2022

(54) DIELECTRIC FILM, DIELECTRIC ELEMENT, AND ELECTRONIC CIRCUIT BOARD

(71) Applicant: TDK CORPORATION, Tokyo (JP)

(72) Inventors: Saori Takahashi, Tokyo (JP); Masahito Furukawa, Tokyo (JP); Masamitsu Haemori, Tokyo (JP); Hiroki Uchiyama, Tokyo (JP); Wakiko Sato, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/702,280

(22) Filed: Dec. 3, 2019

(65) Prior Publication Data
US 2020/0105438 A1    Apr. 2, 2020

Related U.S. Application Data

(63) Continuation-in-part of application No. 16/359,824, filed on Mar. 20, 2019, now Pat. No. 10,991,510.

(30) Foreign Application Priority Data

Mar. 28, 2018   (JP) .............................. JP2018-061459

(51) Int. Cl.
*H01B 3/12*    (2006.01)
*H01G 4/33*    (2006.01)
(Continued)

(52) U.S. Cl.
CPC ............. *H01B 3/12* (2013.01); *H01G 4/1245* (2013.01); *H01G 4/33* (2013.01); *H05K 1/186* (2013.01);
(Continued)

(58) Field of Classification Search
CPC ...... H01G 4/1227; H01G 4/33; H01G 4/1236; C04B 2235/787; C04B 2235/768;
(Continued)

(56) References Cited

U.S. PATENT DOCUMENTS 5,739,563 A * 4/1998 Kawakubo ........ H01L 27/11502
257/295
8,052,954 B2 * 11/2011 Kurozumi ............ C01G 23/006
423/598
(Continued)

FOREIGN PATENT DOCUMENTS

JP    2000-299248 A    10/2000
JP    2004-210601 A  ‡  7/2004
(Continued)

OTHER PUBLICATIONS

Xu et al., "(111 )-Oriented BaTiO3 Thin Films Hydrothermally Formed on TiO2/Si Substrate," Integrated Ferroelectrics, 1996, vol. 12, pp. 233-239.
Jun. 1, 2020 Office Action issued in U.S. Appl. No. 16/359,824.
Nov. 5, 2020 U.S. Office Action issued in U.S. Appl. No. 16/359,824.

*Primary Examiner* — Noah S Wiese
(74) *Attorney, Agent, or Firm* — Oliff PLC (57) ABSTRACT

A dielectric film may be exposed to an acid solution such as hydrochloric acid, nitric acid, or sulfuric acid during a wet process after film formation. The inventors have newly found that when a dielectric film includes Zr having a lower ionization tendency than Ti in a main component of a metal oxide expressed by a general formula $(Ba, Ca)(Ti, Zr)O_3$ is provided and satisfies at least one between relationships such that degree of orientation of (100) plane is higher than degree of orientation of (110) plane, and degree of orientation of (111) plane is higher than degree of orientation of (110) plane in a film thickness direction, the dielectric film
(Continued)

is less likely to be damaged during a wet process, and the resistance to a wet process is improved.

7 Claims, 9 Drawing Sheets

(51) Int. Cl.
  *H01G 4/12* (2006.01)
  *H05K 1/18* (2006.01)
  *H05K 3/30* (2006.01)
(52) U.S. Cl.
  CPC ..... *H05K 3/30* (2013.01); *H05K 2201/10015* (2013.01); *H05K 2203/1316* (2013.01)
(58) Field of Classification Search
  CPC ... C04B 35/4682; C04B 35/49; C04B 35/465; H01L 28/55
  See application file for complete search history.

(56) References Cited

U.S. PATENT DOCUMENTS

| | | | |
|---|---|---|---|
| 2012/0001298 A1* | 1/2012 | Sakurai | B82Y 30/00 257/532 |
| 2013/0065065 A1‡ | 3/2013 | Nakajima | C03C 17/001 428/43 |
| 2016/0217931 A1* | 7/2016 | Saita | H01G 4/1236 |

FOREIGN PATENT DOCUMENTS

| | | | | |
|---|---|---|---|---|
| JP | 2004-210601 A | | 7/2004 | |
| JP | 2009-246242 A | | 10/2009 | |
| JP | 2011-236112 A | ‡ | 11/2011 | ......... C04B 35/4682 |
| JP | 2011-236112 A | | 11/2011 | |
| JP | 2014-172769 A | | 9/2014 | |
| JP | 2016-175782 A | | 10/2016 | |

\* cited by examiner
‡ imported from a related application

| | FILM COMPOSITION $(Ba_{1-x}Ca_x)_z(Ti_{1-y}Zr_y)O_3$ | | | PRODUCTION METHOD |
|---|---|---|---|---|
| | x | y | z | |
| EXAMPLE 1 | 0.300 | 0.300 | 1.010 | SPUTTERING METHOD |
| EXAMPLE 2 | 0.300 | 0.300 | 1.010 | SPUTTERING METHOD |
| EXAMPLE 3 | 0.300 | 0.300 | 1.010 | SPUTTERING METHOD |
| EXAMPLE 4 | 0.300 | 0.300 | 0.900 | SPUTTERING METHOD |
| EXAMPLE 5 | 0.300 | 0.300 | 1.050 | SPUTTERING METHOD |
| EXAMPLE 6 | 0.700 | 0.300 | 1.010 | SPUTTERING METHOD |
| EXAMPLE 7 | 0.300 | 0.700 | 1.010 | SPUTTERING METHOD |
| COMPARATIVE EXAMPLE 1 | 0.300 | – | 1.010 | SPUTTERING METHOD |
| COMPARATIVE EXAMPLE 2 | – | 0.300 | 1.010 | SPUTTERING METHOD |
| COMPARATIVE EXAMPLE 3 | 0.300 | 0.300 | 1.010 | SPUTTERING METHOD |

| | RELATIONSHIP BETWEEN DEGREES OF ORIENTATION | | DAMAGE TO DIELECTRIC FILM | DETERMINATION |
|---|---|---|---|---|
| | F1>F2 | F3>F2 | | |
| EXAMPLE 1 | ✓ | ✗ | NO DAMAGE | ✓ |
| EXAMPLE 2 | ✗ | ✓ | NO DAMAGE | ✓ |
| EXAMPLE 3 | ✓ | ✓ | NO DAMAGE | ✓ |
| EXAMPLE 4 | ✓ | ✗ | NO DAMAGE | ✓ |
| EXAMPLE 5 | ✗ | ✓ | NO DAMAGE | ✓ |
| EXAMPLE 6 | ✗ | ✓ | NO DAMAGE | ✓ |
| EXAMPLE 7 | ✓ | ✓ | NO DAMAGE | ✓ |
| COMPARATIVE EXAMPLE 1 | ✓ | ✗ | DAMAGED | ✗ |
| COMPARATIVE EXAMPLE 2 | ✗ | ✓ | DAMAGED | ✗ |
| COMPARATIVE EXAMPLE 3 | ✗ | ✗ | DAMAGED | ✗ |

Fig.3

| | FILM COMPOSITION $(Ba_{1-x}Ca_x)_z(Ti_{1-y}Zr_y)O_3$ | | | PRODUCTION METHOD | RELATIONSHIP BETWEEN DEGREES OF ORIENTATION | |
|---|---|---|---|---|---|---|
| | x | y | z | | F1>F2 | F3>F2 |
| COMPARATIVE EXAMPLE 4 | 0.300 | 0.300 | 0.995 | SPUTTERING METHOD | × | ✓ |
| EXAMPLE 8 | 0.300 | 0.300 | 0.996 | SPUTTERING METHOD | ✓ | ✓ |
| EXAMPLE 9 | 0.300 | 0.300 | 1.039 | SPUTTERING METHOD | ✓ | ✓ |
| COMPARATIVE EXAMPLE 5 | 0.300 | 0.300 | 1.040 | SPUTTERING METHOD | ✓ | × |
| EXAMPLE 10 | 0.001 | 0.300 | 1.010 | SPUTTERING METHOD | ✓ | × |
| EXAMPLE 11 | 0.500 | 0.300 | 1.010 | SPUTTERING METHOD | ✓ | ✓ |
| COMPARATIVE EXAMPLE 6 | 0.550 | 0.300 | 1.010 | SPUTTERING METHOD | × | ✓ |
| EXAMPLE 12 | 0.300 | 0.001 | 1.010 | SPUTTERING METHOD | ✓ | ✓ |
| EXAMPLE 13 | 0.300 | 0.400 | 1.010 | SPUTTERING METHOD | ✓ | ✓ |
| COMPARATIVE EXAMPLE 7 | 0.300 | 0.500 | 1.010 | SPUTTERING METHOD | ✓ | ✓ |

| | RELATIVE DIELECTRIC CONSTANT (—) | RESISTANCE (MΩ) | DAMAGE TO DIELECTRIC FILM | DETERMINATION |
|---|---|---|---|---|
| COMPARATIVE EXAMPLE 4 | 934 | 137 | NO DAMAGE | × |
| EXAMPLE 8 | 1065 | 4430 | NO DAMAGE | ✓ |
| EXAMPLE 9 | 1681 | 2374 | NO DAMAGE | ✓ |
| COMPARATIVE EXAMPLE 5 | 1382 | 8 | NO DAMAGE | × |
| EXAMPLE 10 | 1588 | 2038 | NO DAMAGE | ✓ |
| EXAMPLE 11 | 1511 | 1988 | NO DAMAGE | ✓ |
| COMPARATIVE EXAMPLE 6 | 922 | 1867 | NO DAMAGE | × |
| EXAMPLE 12 | 1672 | 1002 | NO DAMAGE | ✓ |
| EXAMPLE 13 | 1498 | 1877 | NO DAMAGE | ✓ |
| COMPARATIVE EXAMPLE 7 | 876 | 1798 | NO DAMAGE | × |

Fig.4

| | FILM COMPOSITION $(Ba_{1-x}Ca_x)_z(Ti_{1-y}Zr_y)O_3$ | | | PRODUCTION METHOD | RELATIONSHIP BETWEEN DEGREES OF ORIENTATION | | RELATIONSHIP BETWEEN INTEGRATED INTENSITIES | RELATIVE DIELECTRIC CONSTANT (—) |
|---|---|---|---|---|---|---|---|---|
| | x | y | z | | F1>F2 | F3>F2 | (111)>(110) | |
| EXAMPLE 14 | 0.300 | 0.300 | 1.010 | SPUTTERING METHOD | ✓ | ✓ | ✓ | 2233 |
| EXAMPLE 15 | 0.300 | 0.300 | 1.010 | SPUTTERING METHOD | × | ✓ | ✓ | 2018 |
| EXAMPLE 16 | 0.300 | 0.300 | 1.010 | SPUTTERING METHOD | ✓ | ✓ | × | 1613 |
| EXAMPLE 17 | 0.300 | 0.300 | 1.010 | SPUTTERING METHOD | ✓ | × | × | 1566 |

| | RESISTANCE (MΩ) | DAMAGE TO DIELECTRIC FILM | DETERMINATION |
|---|---|---|---|
| EXAMPLE 14 | 6716 | NO DAMAGE | ✓+ |
| EXAMPLE 15 | 4288 | NO DAMAGE | ✓+ |
| EXAMPLE 16 | 3832 | NO DAMAGE | ✓ |
| EXAMPLE 17 | 3288 | NO DAMAGE | ✓ |

Fig.5

| | FILM COMPOSITION $(Ba_{1-x}Ca_x)_z(Ti_{1-y}Zr_y)O_3$ | | | ADDITIVE | WITH RESPECT TO 100 mol OF MAIN COMPONENT (mol) | PRODUCTION METHOD |
|---|---|---|---|---|---|---|
| | x | y | z | | | |
| EXAMPLE 18 | 0.300 | 0.300 | 1.010 | MnO | 0.30 | SPUTTERING METHOD |
| EXAMPLE 19 | 0.300 | 0.300 | 1.010 | CuO | 0.30 | SPUTTERING METHOD |
| EXAMPLE 20 | 0.300 | 0.300 | 1.010 | $Cr_2O_3$ | 0.30 | SPUTTERING METHOD |
| EXAMPLE 21 | 0.300 | 0.300 | 1.010 | $Al_2O_3$ | 0.30 | SPUTTERING METHOD |
| EXAMPLE 22 | 0.300 | 0.300 | 1.010 | $Ga_2O_3$ | 0.30 | SPUTTERING METHOD |
| EXAMPLE 23 | 0.300 | 0.300 | 1.010 | $In_2O_3$ | 0.30 | SPUTTERING METHOD |
| EXAMPLE 24 | 0.300 | 0.300 | 1.010 | $V_2O_5$ | 0.30 | SPUTTERING METHOD |
| EXAMPLE 25 | 0.300 | 0.300 | 1.010 | $Y_2O_3$ | 0.30 | SPUTTERING METHOD |
| EXAMPLE 26 | 0.300 | 0.300 | 1.010 | $Dy_2O_3$ | 0.30 | SPUTTERING METHOD |

| | RELATIONSHIP BETWEEN DEGREES OF ORIENTATION | | RELATIVE DIELECTRIC CONSTANT (−) | RESISTANCE (MΩ) | DAMAGE TO DIELECTRIC FILM | DETERMINATION |
|---|---|---|---|---|---|---|
| | F1>F2 | F3>F2 | | | | |
| EXAMPLE 18 | ✓ | × | 1426 | 90390 | NO DAMAGE | ✓+ |
| EXAMPLE 19 | ✓ | ✓ | 1456 | 28948 | NO DAMAGE | ✓+ |
| EXAMPLE 20 | ✓ | × | 1332 | 70980 | NO DAMAGE | ✓+ |
| EXAMPLE 21 | ✓ | ✓ | 1335 | 28771 | NO DAMAGE | ✓+ |
| EXAMPLE 22 | × | ✓ | 1411 | 64450 | NO DAMAGE | ✓+ |
| EXAMPLE 23 | ✓ | × | 1301 | 46850 | NO DAMAGE | ✓+ |
| EXAMPLE 24 | ✓ | ✓ | 1576 | 100260 | NO DAMAGE | ✓+ |
| EXAMPLE 25 | ✓ | ✓ | 1353 | 20550 | NO DAMAGE | ✓+ |
| EXAMPLE 26 | ✓ | × | 1415 | 14473 | NO DAMAGE | ✓+ |

Fig.6

| | FILM COMPOSITION $(Ba_{1-x}Ca_x)_z(Ti_{1-y}Zr_y)O_3$ | | | ADDITIVE | WITH RESPECT TO 100 mol OF MAIN COMPONENT (mol) | PRODUCTION METHOD | RELATIONSHIP BETWEEN DEGREES OF ORIENTATION | |
|---|---|---|---|---|---|---|---|---|
| | x | y | z | | | | F1>F2 | F3>F2 |
| EXAMPLE 27 | 0.300 | 0.300 | 1.010 | MnO | 0.30 | SPUTTERING METHOD | ✓ | ✓ |
| EXAMPLE 28 | 0.300 | 0.300 | 1.010 | MnO | 0.30 | SPUTTERING METHOD | × | ✓ |

| | RELATIONSHIP BETWEEN INTEGRATED INTENSITIES (111)>(100) | RELATIVE DIELECTRIC CONSTANT (—) | RESISTANCE (MΩ) | DAMAGE TO DIELECTRIC FILM | DETERMINATION |
|---|---|---|---|---|---|
| EXAMPLE 27 | ✓ | 2002 | 83310 | NO DAMAGE | ✓+ |
| EXAMPLE 28 | ✓ | 2115 | 77290 | NO DAMAGE | ✓+ |

Fig.7

| | FILM COMPOSITION $(Ba_{1-x}Ca_x)_z(Ti_{1-y}Zr_y)O_3$ | | | ADDITIVE | WITH RESPECT TO 100 mol OF MAIN COMPONENT (mol) | PRODUCTION METHOD | RELATIONSHIP BETWEEN DEGREES OF ORIENTATION | |
|---|---|---|---|---|---|---|---|---|
| | x | y | z | | | | F1>F2 | F3>F2 |
| EXAMPLE 29 | 0.300 | 0.300 | 1.010 | MnO | 0.01 | SPUTTERING METHOD | ✓ | ✓ |
| EXAMPLE 30 | 0.300 | 0.300 | 1.010 | MnO | 2.00 | PLD METHOD | ✓ | ✓ |
| EXAMPLE 31 | 0.300 | 0.300 | 1.010 | MnO | 5.00 | SPUTTERING METHOD | ✓ | × |
| EXAMPLE 32 | 0.300 | 0.300 | 1.010 | MnO | 7.00 | SPUTTERING METHOD | × | ✓ |
| EXAMPLE 33 | 0.300 | 0.300 | 1.010 | MnO | 8.00 | SPUTTERING METHOD | ✓ | ✓ |
| EXAMPLE 34 | 0.300 | 0.300 | 1.010 | MnO+Y$_2$O$_3$ | 1.00 | SPUTTERING METHOD | ✓ | ✓ |
| EXAMPLE 35 | 0.300 | 0.300 | 1.010 | CuO+Y$_2$O$_3$+V$_2$O$_5$ | 1.50 | SPUTTERING METHOD | ✓ | × |

| | RELATIVE DIELECTRIC CONSTANT (—) | RESISTANCE (MΩ) | DAMAGE TO DIELECTRIC FILM | DETERMINATION |
|---|---|---|---|---|
| EXAMPLE 29 | 1533 | 10447 | NO DAMAGE | ✓+ |
| EXAMPLE 30 | 1481 | 68300 | NO DAMAGE | ✓+ |
| EXAMPLE 31 | 1327 | 55110 | NO DAMAGE | ✓+ |
| EXAMPLE 32 | 1166 | 36930 | NO DAMAGE | ✓+ |
| EXAMPLE 33 | 1082 | 6696 | NO DAMAGE | ✓ |
| EXAMPLE 34 | 1376 | 60730 | NO DAMAGE | ✓+ |
| EXAMPLE 35 | 1310 | 87810 | NO DAMAGE | ✓+ |

Fig.8

| | FILM COMPOSITION $(Ba_{1-x}Ca_x)_z(Ti_{1-y}Zr_y)O_3$ | | | ADDITIVE | WITH RESPECT TO 100 mol OF MAIN COMPONENT (mol) | PRODUCTION METHOD | RELATIONSHIP BETWEEN DEGREES OF ORIENTATION | |
|---|---|---|---|---|---|---|---|---|
| | x | y | z | | | | F1>F2 | F3>F2 |
| EXAMPLE 36 | — | 0.300 | 1.010 | — | — | SPUTTERING METHOD | × | ✓ |
| EXAMPLE 37 | — | 0.050 | 1.010 | — | — | PLD METHOD | × | ✓ |
| EXAMPLE 38 | — | 0.100 | 1.010 | — | — | SPUTTERING METHOD | ✓ | × |

| | RELATIVE DIELECTRIC CONSTANT (—) | RESISTANCE (MΩ) | DAMAGE TO DIELECTRIC FILM | DETERMINATION |
|---|---|---|---|---|
| EXAMPLE 36 | 1316 | 2419 | NO DAMAGE | ✓ |
| EXAMPLE 37 | 1706 | 997 | NO DAMAGE | ✓ |
| EXAMPLE 38 | 1675 | 1601 | NO DAMAGE | ✓ |

DIELECTRIC FILM, DIELECTRIC ELEMENT, AND ELECTRONIC CIRCUIT BOARD

CROSS-REFERENCE TO RELATED APPLICATIONS

This is a Continuation-In-Part application of U.S. application Ser. No. 16/359,824, filed on 20 Mar. 2019.

TECHNICAL FIELD

The present disclosure relates to a dielectric film, a dielectric element, and an electronic circuit board.

BACKGROUND

In the related art, for example, a metal oxide (general formula: $ABO_3$) having a Perovskite structure such as barium titanate ($BaTiO_3$) has been utilized as a dielectric material for dielectric elements such as thin-film capacitors. A dielectric film may be exposed to an acid solution during a wet process such as plating or wet etching after being formed as a film to be fabricated as an element. At this time, the dielectric film may be damaged by the acid solution.

The following Patent Literature 1 discloses a technology of enhancing the resistance of a dielectric film consisting of a metal oxide having a Perovskite structure to a wet process.
[Patent Literature 1] Japanese Unexamined Patent Publication No. 2004-210601
[Patent Literature 2] Japanese Unexamined Patent Publication No. 2011-236112

SUMMARY

The inventors have repeatedly researched resistance of a dielectric film consisting of a metal oxide having a Perovskite structure to a wet process and have newly found a technology in which the resistance to a wet process can be further improved.

According to the present disclosure, a dielectric film, a dielectric element, and an electronic circuit board improved in resistance to a wet process are provided.

According to an embodiment of the present disclosure, a dielectric film including a metal oxide as a main component having a cubic structure expressed by a general formula $(Ba, Ca)(Ti, Zr)O_3$ is provided and satisfies at least one between relationships such that degree of orientation of (100) plane is higher than degree of orientation of (110) plane, and degree of orientation of (111) plane is higher than degree of orientation of (110) plane in a film thickness direction.

The inventors have found that when the main component of a dielectric film includes Zr having a lower ionization tendency than Ti and when a film density is increased by raising the degree of orientation of at least one of a (100) plane and a (111) plane to be higher than the degree of orientation of a (110) plane, situations in which the dielectric film is damaged during a wet process are significantly reduced.

In the dielectric film according to the embodiment, the metal oxide included as the main component may be expressed by a general formula $(Ba_{1-x}Ca_x)_z(Ti_{1-y}Zr_y)O_3$ and $0.001 \leq x \leq 0.500$, $0.001 \leq y \leq 0.400$, and $0.995 < z < 1.040$ may be satisfied. In this case, a relative dielectric constant and a resistance are improved.

In the dielectric film according to the embodiment, the metal oxide included as the main component may be expressed by a general formula $(Ba_{1-x}Ca_x)_z(Ti_{1-y}Zr_y)O_3$ and $0 \leq x \leq 0.500$, $0.001 \leq y \leq 0.400$, and $0.995 < z < 1.040$ may be satisfied. In this case, a relative dielectric constant and a resistance are improved.

In the dielectric film according to the embodiment, an integrated intensity of a diffraction peak of a (111) plane may be higher than an integrated intensity of a diffraction peak of a (100) plane in an X-ray diffraction chart related to the film thickness direction. In this case, the integrated intensity of the diffraction peak of the (111) plane having a high relative dielectric constant is increased. Therefore, the relative dielectric constant is further improved.

The dielectric film according to the embodiment may further include at least one selected from the group consisting of Mn, Cu, Cr, Al, Ga, In, V, and a rare earth element as an additive. In this case, an abundance ratio of a grain boundary of the additive is higher than an abundance ratio inside grains. Therefore, the resistance of the grain boundary increases. As a result, the resistance of the dielectric film is improved.

In the dielectric film according to the embodiment, the additive may be included within a range of 0.01 mol to 7.00 mol with respect to 100 mol of the main component.

The dielectric film may be formed as a film by sputtering in an inert gas (for example, Ar) atmosphere, sputtering in a mixed gas including a reactive gas (for example, $O_2$) atmosphere, pulsed laser deposition (PLD), or other methods. The method for forming the dielectric film above is not limited to sputtering and PLD.

According to another embodiment of the present disclosure, there is provided a dielectric element including the dielectric film described above and an electrode.

According to another embodiment of the present disclosure, there is provided an electronic circuit board including the dielectric element described above.

BRIEF DESCRIPTION OF THE DRAWINGS

FIG. 8 is a table showing experimental results according to examples of the present disclosure.

DETAILED DESCRIPTION

Hereinafter, an embodiment and various examples will be described with reference to the drawings. In each of the drawings, the same reference signs are applied to parts which are the same or corresponding, and duplicated description thereof will be omitted.

Figure 1:
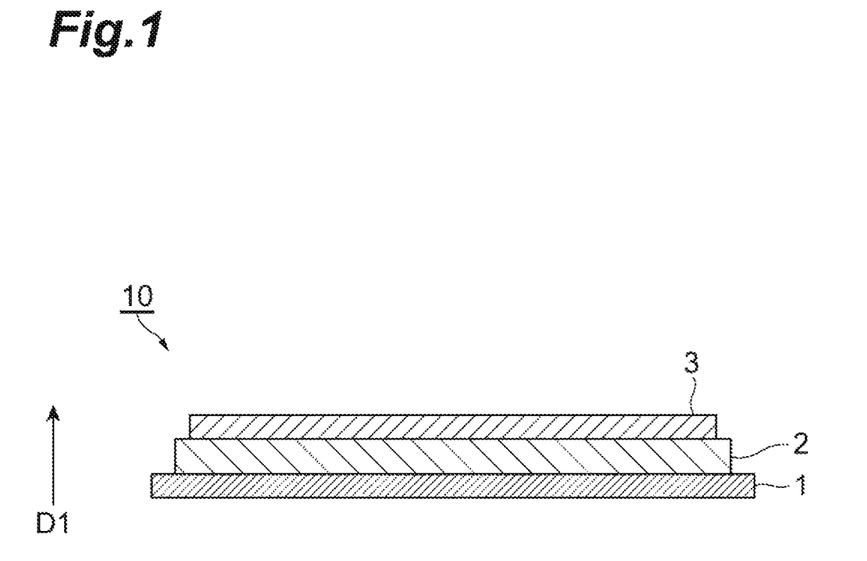
FIG. 1 is a view illustrating a lamination structure of a thin-film capacitor according to an embodiment of the present disclosure.

FIG. 1 illustrates a thin-film capacitor 10 as an example of a dielectric element. As illustrated in FIG. 1, the thin-film capacitor 10 has a lamination structure including a lower electrode 1, a dielectric film 2, and an upper electrode 3. The thin-film capacitor 10 has a configuration in which the dielectric film 2 is interposed between the lower electrode 1 and the upper electrode 3.

Both the lower electrode 1 and the upper electrode 3 are thin-film electrodes. The lower electrode 1 and the upper electrode 3 face each other in a lamination direction D1 of the thin-film capacitor 10. For example, the lower electrode 1 and the upper electrode 3 can be constituted of a metal such as Ni or Cu. In the present embodiment, the lower electrode 1 is a non-orientation Ni foil, and the upper electrode 3 is a Cu film.

The dielectric film 2 is a thin film which includes, as a main component, a metal oxide having a cubic structure (Perovskite structure) expressed by a general formula (Ba, Ca)(Ti, Zr)$O_3$ (which may hereinafter be referred to as BCTZ). When the composition of the main component BCTZ of the dielectric film 2 is expressed as $(Ba_{1-x}Ca_x)_z(Ti_{1-y}Zr_y)O_3$, it is possible to design a dielectric film satisfying $0.001 \leq x \leq 0.500$ (or $0 \leq x \leq 0.500$), $0.001 \leq y \leq 0.400$, and $0.995 < z < 1.040$. The dielectric film 2 can include, as an additive, at least one selected from the group consisting of Mn, Cu, Cr, Al, Ga, In, V and a rare earth element. The dielectric film 2 may include the additive within a range of 0.01 mol to 7.00 mol with respect to 100 mol of the main component. The thickness of the dielectric film 2 may be within a range of 40 to 2,000 nm. As an example, the thickness of the dielectric film 2 is 600 nm.

The dielectric film 2 is an oriented growth thin film (so-called oriented film), and the degree of orientation is adjustable. Specifically, when the degree of orientation of a (100) plane is F1, the degree of orientation of a (110) plane is F2, and the degree of orientation of a (111) plane is F3 with respect to a film thickness direction of the dielectric film 2 (that is, the lamination direction D1 of the thin-film capacitor 10), the degrees of orientation are adjusted such that at least one of F1>F2 and F3>F2 is satisfied. In the present embodiment, the dielectric film 2 satisfies both F1>F2 and F3>F2.

The degree of orientation of each of the (100) plane, the (110) plane, and the (111) plane was obtained from an X-ray diffraction pattern. That is, the degree F. of orientation of an (hid) plane was obtained based on the ratio of the integrated intensity of diffraction from the (hid) plane to (the integrated intensity of diffraction from the (100) plane, the integrated intensity of diffraction from the (110) plane, and the integrated intensity of diffraction from the (111) plane). Hereinafter, Fp indicates the degree of orientation of a powder sample, and Ff indicates the degree of orientation of a thin film sample. The (hkl) plane having the degree Fp of orientation with respect to a non-orientation BCTZ powder sample was Fp(100) plane/Fp(110) plane=0.12 and Fp(111) plane/Fp(110) plane=0.17. Therefore, when the degree of orientation of a dielectric film became Ff(100)/Ff(110)>0.12 and Ff(111)/Ff(110)>0.17, it is determined that there was preferential orientation of a crystal plane. The integrated intensity was calculated by using synthetic powder X-ray analysis software PDXL (manufactured by Rigaku Corporation).

The degree of orientation of the dielectric film 2 can be adjusted in accordance with conditions of film formation. For example, when the dielectric film 2 is formed as a film using a sputtering method, the degree of orientation of the dielectric film 2 can be adjusted by changing the conditions of sputtering, such as the type of gas, the pressure, or the film formation temperature. When forming the dielectric film 2 by pulsed laser deposition (PLD), the degree of orientation of the dielectric film 2 can be adjusted by changing the conditions of film formation, such as pulse frequency of the pulsed laser or formation rate.

In the dielectric film 2 in an X-ray diffraction chart related to the film thickness direction, the integrated intensity of the diffraction peak of the (111) plane is higher than the integrated intensity of the diffraction peak of the (100) plane.

The dielectric film 2 described above may be exposed to an acid solution such as hydrochloric acid, nitric acid, or sulfuric acid during a wet process after film formation (for example, a step of element fabrication). For example, the dielectric film 2 may be immersed in an acid solution having a concentration within a range of 0.1 mol/L to 10 mol/L for a period within a range of 10 seconds to 1 hour. The inventors have newly found that when the dielectric film 2 includes Zr having a lower ionization tendency than Ti in the main component BCTZ and when the film density is increased by at least one of F1>F2 and F3>F2 being satisfied, situations in which Ti in BCTZ is eluted due to an acid solution are significantly reduced. As a result, the dielectric film 2 is less likely to be damaged during a wet process, and improvement in resistance to a wet process is realized.

When the composition $(Ba_{1-x}Ca_x)_z(Ti_{1-y}Zr_y)O_3$ of the main component BCTZ of the dielectric film 2 satisfies $0 \leq x \leq 0.500$ (or $0.001 \leq x \leq 0.500$), $0.001 \leq y \leq 0.400$, and $0.995 < z < 1.040$, the relative dielectric constant and the resistance are improved.

Moreover, in the X-ray diffraction chart related to the film thickness direction of the dielectric film 2, when the integrated intensity of the diffraction peak of the (111) plane is higher than the integrated intensity of the diffraction peak of the (100) plane, the relative dielectric constant of the dielectric film 2 is further improved.

When the dielectric film 2 includes, as an additive, at least one selected from the group consisting of Mn, Cu, Cr, Al, Ga, In, V, and a rare earth element, the abundance ratio of a grain boundary of the additive is higher than the abundance ratio inside grains. Therefore, the resistance of the grain boundary increases. As a result, the resistance of the dielectric film 2 is improved.

EXAMPLES

Hereinafter, the details and the results of experiments performed by the inventors will be described with reference to the tables in FIGS. 2 to 7.

In order to confirm the relationship between the degree of orientation of (Ba, Ca)(Ti, Zr)$O_3$ and the resistance to a wet process, the inventors prepared a plurality of samples having dielectric films different from each other in the film composition and the degree of orientation of the (100) plane, the (110) plane, and the (111) plane and determined the resistance to a wet process of each of the samples. The determination of the resistance to a wet process was confirmed after a dielectric film was immersed in an acid solution, by observing damage to the dielectric film 2 in a 200 μm×200 μm area using an optical microscope and observing a 20 μm×20 μm area using an SEM. More specifically, cracking and film peeling were observed in 10 observation areas using the optical microscope and the SEM. For samples in which no damage was observed at all, they were indicated with "no damage". For samples in which one or more spots of damage were observed, they were indicated with "damaged".

Figure 2:
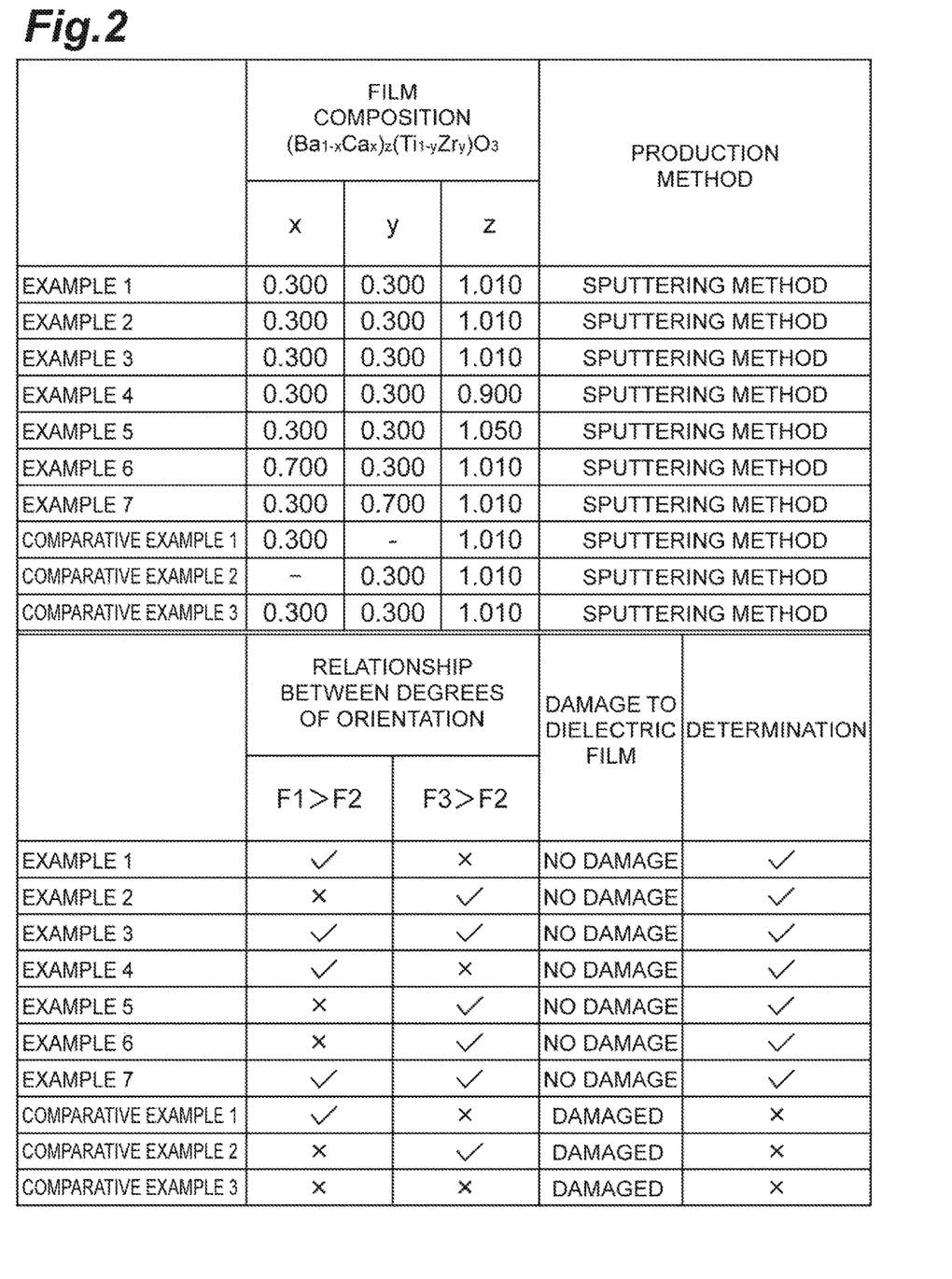
FIG. 2 is a table showing experimental results according to examples of the present disclosure.

The table of FIG. 2 shows the results. All of the samples according to Examples 1 to 7 and the Comparative Examples 1 to 3 shown in the table of FIG. 2 were formed as films by a sputtering method. More specifically, the films were formed by sputtering in a mixed gas atmosphere of Ar and $O_2$ (Ar:$O_2$=3:1). Since the sputtering targets of the samples tend to break easily, they have a more densified configuration obtained by slow crystal growth, and the sputtering acceleration voltage may be set relatively low. Specifically, the acceleration voltage may be set to about 2800 to 12000 W/m$^2$ per unit area of the sputtering target. This is lower than a normal acceleration voltage (16000 to 29000 W/m$^2$).

The samples according to Examples 1 to 3 had the same composition $(Ba_{1-x}Ca_x)_z(Ti_{1-y}Zr_y)O_3$ of the main component BCTZ (that is, x=0.300, y=0.300, and Z=1.010) and differed from each other in only the relationship between the degrees of orientation. Regarding the degree of orientation, the sample according to Example 1 satisfied only the relationship F1>F2, the sample according to Example 2 satisfied only the relationship F3>F2, and the sample according to Example 3 satisfied both the relationships F1>F2 and F3>F2. As the results of determination of the resistance to a wet process in the samples according to Examples 1 to 3, all of the samples according to Examples 1 to 3 were indicated with "no damage".

The samples according to Examples 4 to 7 differed from each other in the composition of the main component BCTZ. Regarding the degree of orientation, the sample according to Example 4 satisfied only the relationship F1>F2, both the samples according to Examples 5 and 6 satisfied only the relationship F3>F2, and the sample according to Example 7 satisfied both the relationships F1>F2 and F3>F2. As the results of determination of the resistance to a wet process in the samples according to Examples 4 to 7, all of the samples according to Examples 4 to 7 were indicated with "no damage".

The sample according to the Comparative Example 1 was constituted of a metal oxide (that is, a metal oxide expressed by (Ba, Ca)TiO$_3$) including no Zr. The sample according to the Comparative Example 2 was constituted of a metal oxide (that is, a metal oxide expressed by Ba(Ti, Zr)O$_3$) including no Ca. As the results of determination of the resistance to a wet process in the samples according to the Comparative Examples 1 and 2, both the samples according to the Comparative Examples 1 and 2 were indicated with "damaged". In particular, the sample according to the Comparative Example 2 was determined "damaged" because one cracking/film peeling was observed in the 10 observation areas. However, a dielectric film including BCTZ including no Ca, as a main component, such as the sample according to the Comparative Example 2 may be indicated with "no damage" by appropriately selecting and adjusting the methods and conditions of film formation as described below for Examples 36 to 38.

The sample according to the Comparative Example 3 had the same composition of the main component BCTZ as the sample according to Example 1 and differed from Example 1 in the relationship between the degrees of orientation. That is, the sample according to the Comparative Example 3 satisfied neither of the relationships F1>F2 and F3>F2. As the result of determination of the resistance to a wet process in the sample according to the Comparative Example 3, it was indicated with "damaged".

From the results described above, when at least one of F1>F2 and F3>F2 was satisfied in the dielectric films including BCTZ as a main component, it was confirmed that the resistance to a wet process was improved.

In order to confirm the relationship between the composition and the relative dielectric constant and the resistance of dielectric layers, the inventors prepared a plurality of samples having different film compositions and determined the relative dielectric constant and the resistance (MΩ) of each of the samples. In determination of the relative dielectric constant, the relative dielectric constant of 1,000 was adopted as a standard. In determination of the resistance, 100 MΩ was adopted as a standard.

Figure 3:
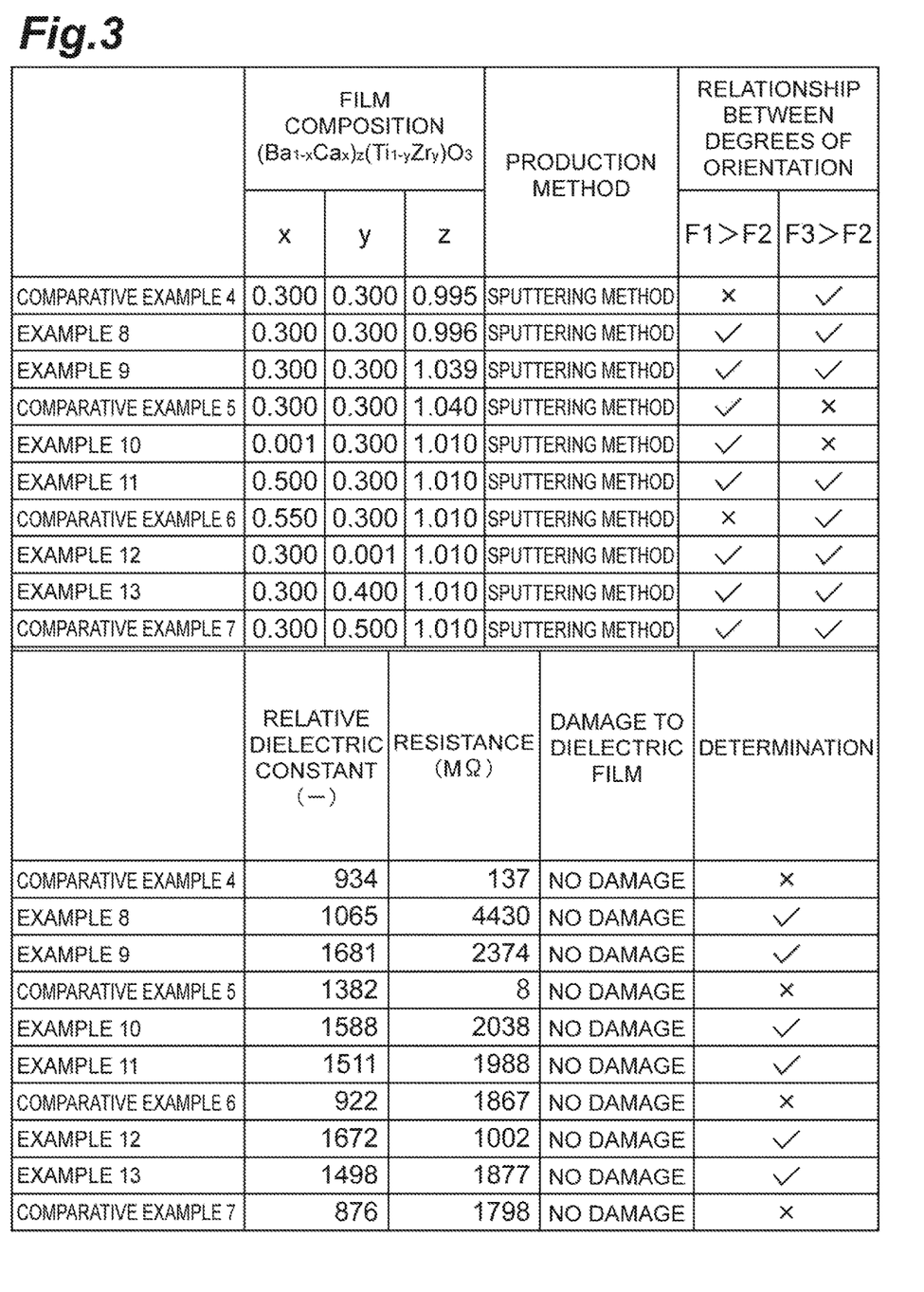
FIG. 3 is a table showing experimental results according to examples of the present disclosure.

The table of FIG. 3 shows the results. In the table of FIG. 3, the determination of the samples in which both the relative dielectric constant and the resistance exceeded the foregoing standards was indicated with "✓". All of the samples according to Examples 8 to 13 and the Comparative Examples 4 to 7 shown in the table of FIG. 3 were formed as films by a sputtering method.

Regarding the composition of the main component BCTZ in the dielectric layer, the samples according to Examples 8 and 9 satisfied all of 0≤x≤0.500, 0.001≤y≤0.400, and 0.995<z<1.040. However, in the sample according to the Comparative Example 4, z was 0.995, which was beyond the lower limit of 0.995<z<1.040.

Regarding the composition of the main component BCTZ in the dielectric layer, the samples according to Examples 10 and 11 satisfied all of 0≤x≤0.500, 0.001≤y≤0.400, and 0.995<z<1.040. However, in the sample according to the Comparative Example 5, z was 1.040, which was beyond the upper limit of 0.995<z<1.040.

Regarding the composition of the main component BCTZ in the dielectric layer, the samples according to Examples 12 and 13 satisfied all of 0≤x≤0.500, 0.001≤y≤0.400, and 0.995<z<1.040. However, in the sample according to the Comparative Example 6, x was 0.550, which was beyond the upper limit of 0≤x≤0.500. In the sample according to the Comparative Example 7, y was 0.500, which was beyond the upper limit of 0.001≤y≤0.400.

From the results described above, it was confirmed that when all of 0≤x≤0.500, 0.001≤y≤0.400, and 0.995<z<1.040 were satisfied regarding the composition of the main component $(Ba_{1-x}Ca_x)_z(Ti_{1-y}Zr_y)O_3$ in the dielectric layer, the relative dielectric constant and the resistance were improved.

All of the samples according to Examples 8 to 13 and the Comparative Examples 4 to 7 shown in the table of FIG. 3 included BCTZ as a main component and satisfied at least one of F1>F2 and F3>F2. Therefore, the determination of the resistance to a wet process was indicated with "no damage", and the resistance to a wet process was improved in all of the samples according to Examples 8 to 13 and the Comparative Examples 4 to 7.

Moreover, in order to confirm the relationship between the integrated intensity of the diffraction peak and the relative dielectric constant in the X-ray diffraction chart related to the film thickness direction, the inventors prepared a plurality of samples having different degrees of orientation and determined the relative dielectric constant of each of the samples. In determination of the relative dielectric constant, the relative dielectric constant of 2,000 was adopted as a standard.

Figure 4:
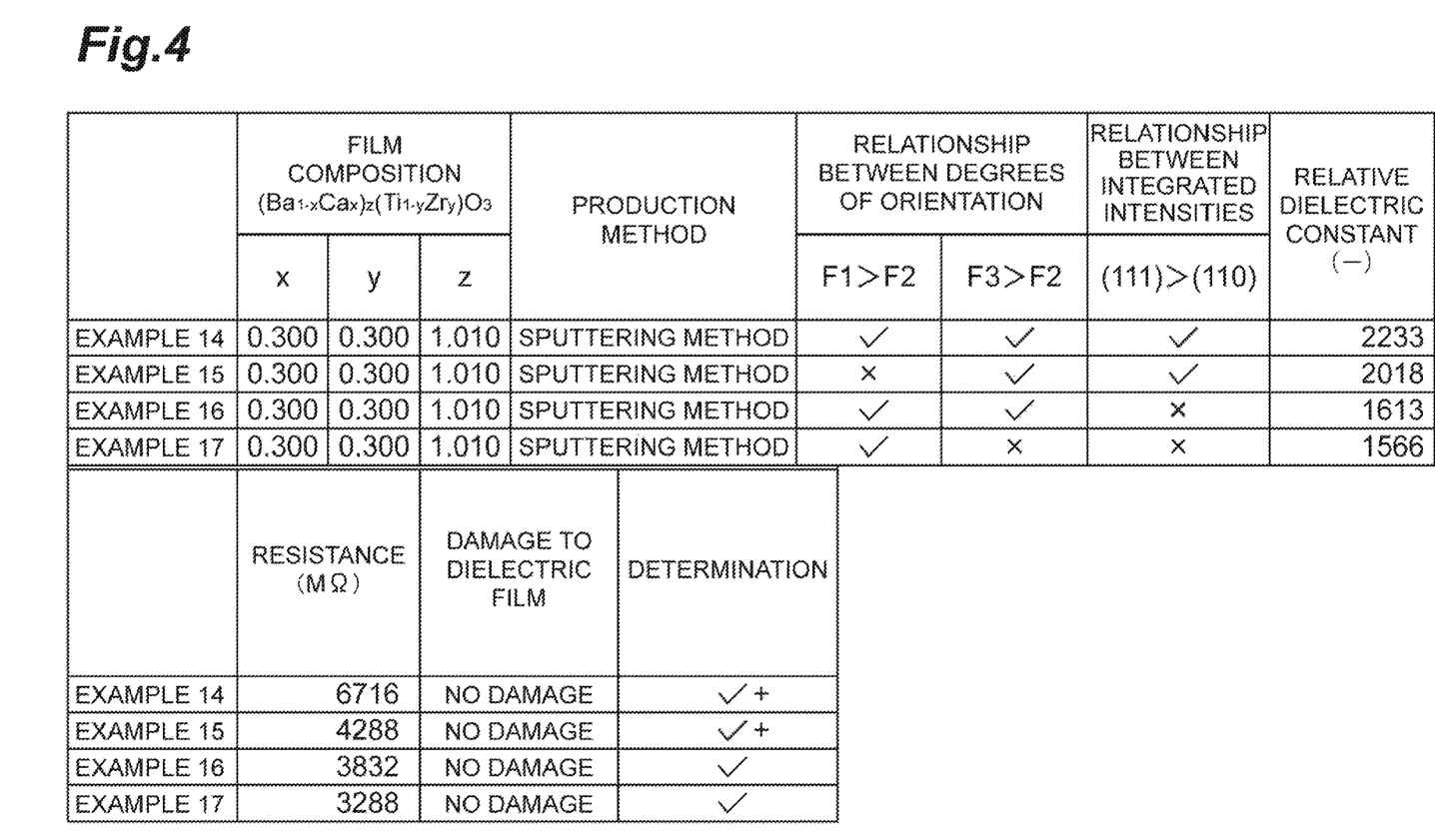
FIG. 4 is a table showing experimental results according to examples of the present disclosure.

The table of FIG. 4 shows the results. In the table of FIG. 4, the determination of the samples in which the relative dielectric constant exceeded the foregoing standards was indicated with "✓+". All of the samples according to Examples 14 to 17 shown in the table of FIG. 4 were formed as films by a sputtering method.

Both the samples according to Examples 14 and 15 had the same composition $(Ba_{1-x}Ca_x)_z(Ti_{1-y}Zr_y)O_3$ of the main component BCTZ (that is, x=0.300, y=0.300, and Z=1.010) while having the integrated intensity of the diffraction peak of the (111) plane higher than the integrated intensity of the diffraction peak of the (100) plane and differed from each other in only the relationship between the degrees of orientation. Regarding the degree of orientation, the sample according to Example 14 satisfied both the relationships F1>F2 and F3>F2, and the sample according to Example 15 satisfied only the relationship F3>F2. In both the samples according to Examples 14 and 15, an extremely high relative dielectric constant exceeding the foregoing standards could be obtained.

Both the samples according to Examples 16 and 17 had the same composition $(Ba_{1-x}Ca_x)_z(Ti_{1-y}Zr_y)O_3$ of the main component BCTZ (that is, x=0.300, y=0.300, and Z=1.010) while having the integrated intensity of the diffraction peak of the (111) plane not higher than the integrated intensity of the diffraction peak of the (100) plane and differed from each other in only the relationship between the degrees of orientation. Regarding the degree of orientation, the sample according to Example 16 satisfied both the relationships F1>F2 and F3>F2, and the sample according to Example 17 satisfied only the relationship F1>F2. In both the samples according to Examples 16 and 17, although the foregoing standards were not exceeded, a high relative dielectric constant could be obtained.

From the results described above, it was confirmed that when the integrated intensity of the diffraction peak of the (111) plane was higher than the integrated intensity of the diffraction peak of the (100) plane in the X-ray diffraction chart related to the film thickness direction, the relative dielectric constant of the dielectric film was further improved.

All of the samples according to Examples 14 to 17 shown in the table of FIG. 4 included BCTZ as a main component and satisfied at least one of F1>F2 and F3>F2. Therefore, the determination of the resistance to a wet process was indicated with "no damage", and the resistance to a wet process was improved in all of the samples according to Examples 14 to 17.

In order to confirm the relationship between the additive and the resistance of the dielectric film, the inventors prepared a plurality of samples having different additives and determined the resistance (MΩ) of each of the samples. In determination of the resistance, the resistance of 10,000 MΩ was adopted as a standard.

Figure 5:
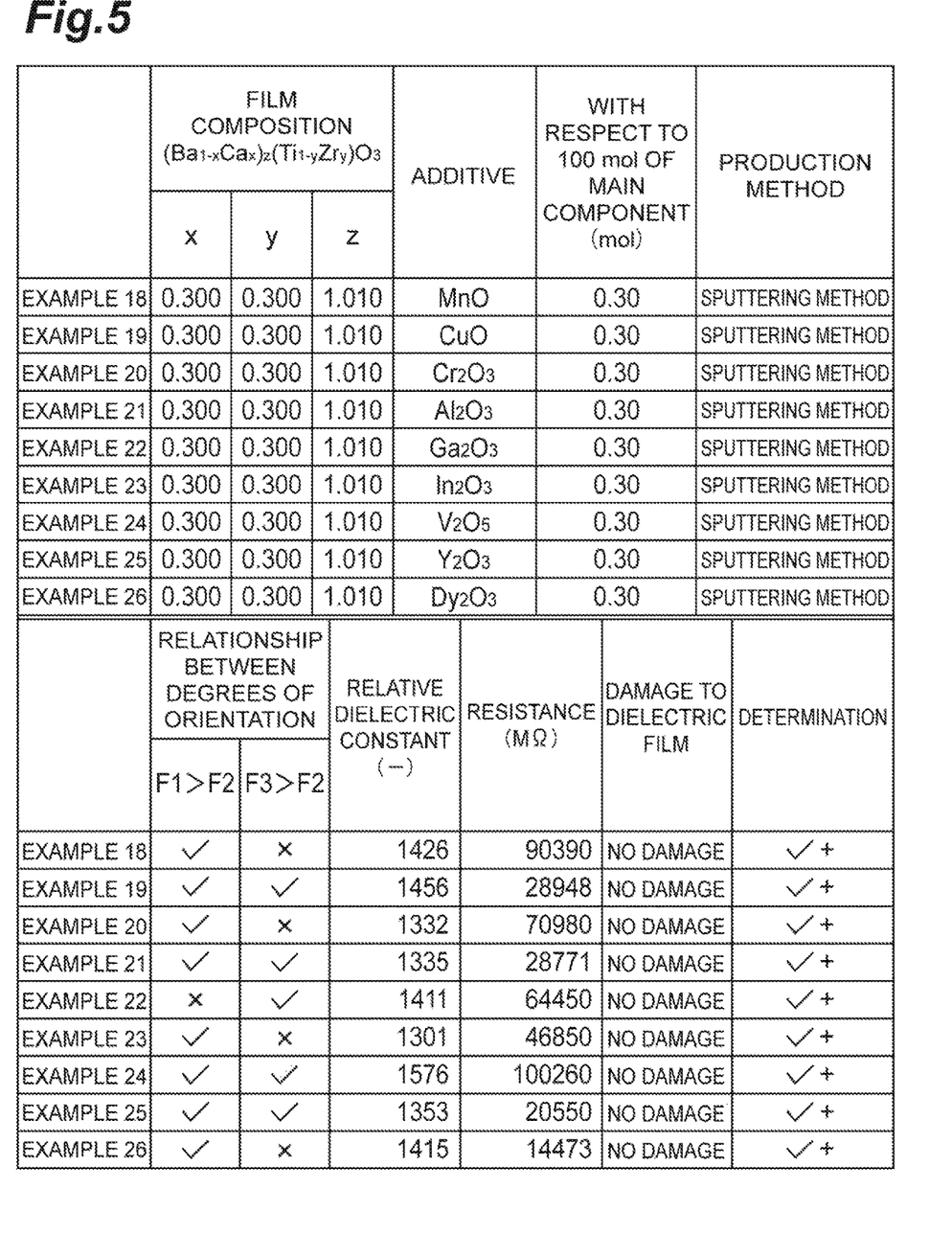
FIG. 5 is a table showing experimental results according to examples of the present disclosure.

The table of FIG. 5 shows the results. In the table of FIG. 5, the determination of the samples in which the resistance exceeded the foregoing standards was indicated with "✓+". All of the samples according to Examples 18 to 26 shown in the table of FIG. 5 were formed as films by a sputtering method.

The samples according to Examples 18 to 26 respectively included MnO, CuO, $Cr_2O_3$, $Al_2O_3$, $Ga_2O_3$, $In_2O_3$, $V_2O_5$, $Y_2O_3$, and $Dy_2O_3$, as an additive. All of the samples according to Examples 18 to 26 included 0.30 mol of the corresponding additive with respect to 100 mol of the main component.

The resistance of each of the samples according to Examples 18 to 26 was obtained. As a result, a high resistance could be obtained in all of Examples 18 to 26.

From the results described above, it was confirmed that when a dielectric film included BCTZ as a main component and included at least one of the foregoing additives (Mn, Cu, Cr, Al, Ga, In, V and a rare earth element), the resistance of the dielectric film was improved compared to when having it included no additive (for example, Examples 1 to 17).

All of the samples according to Examples 18 to 26 shown in the table of FIG. 5 included BCTZ as a main component and satisfied at least one of F1>F2 and F3>F2. Therefore, the determination of the resistance to a wet process was indicated with "no damage", and the resistance to a wet process was improved in all of the samples according to Examples 18 to 26.

Moreover, the inventors also confirmed the case in which a dielectric film includes an additive and the integrated intensity of the diffraction peak of the (111) plane was higher than the integrated intensity of the diffraction peak of the (100) plane in the X-ray diffraction chart related to the film thickness direction. The table of FIG. 6 shows the results.

Figure 6:
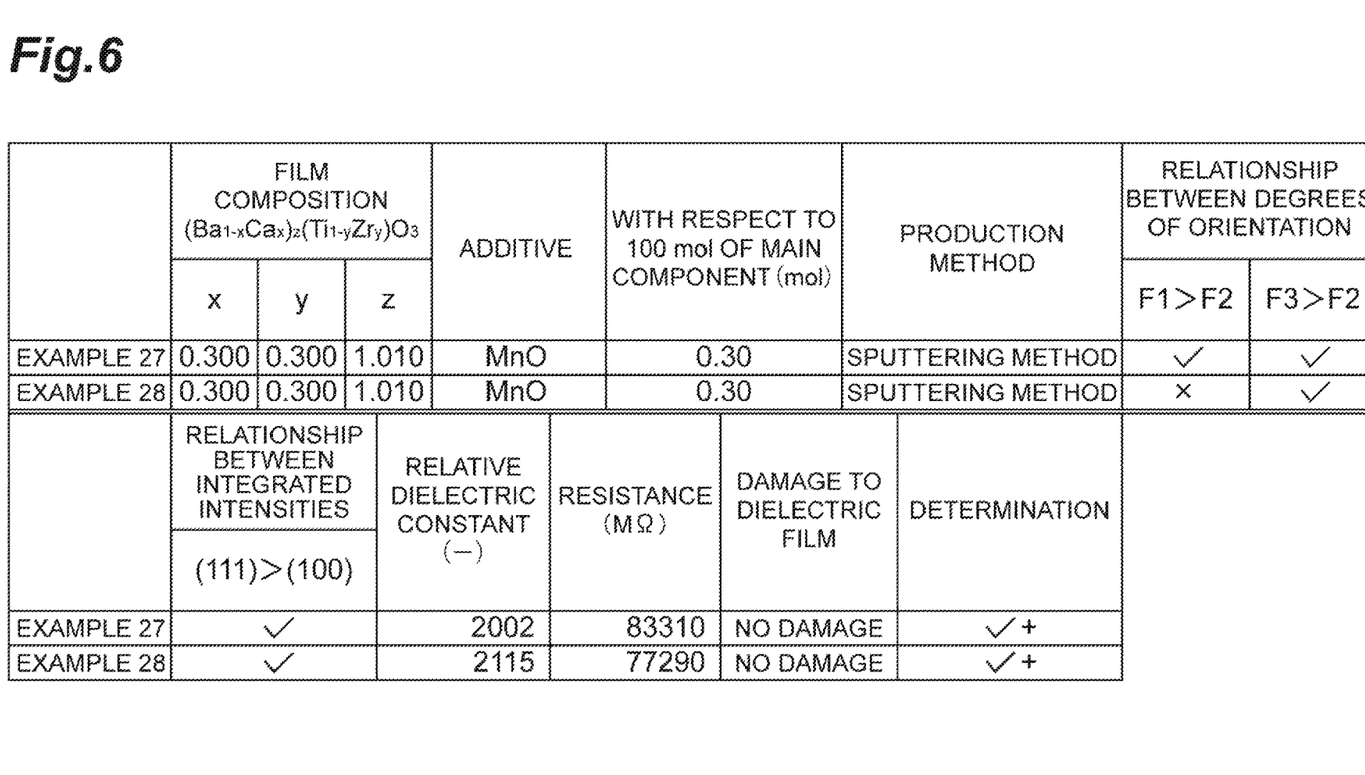
FIG. 6 is a table showing experimental results according to examples of the present disclosure.

Both the samples according to Examples 27 and 28 shown in the table of FIG. 6 included MnO as an additive. Both the samples according to Examples 27 and 28 included 0.30 mol of MnO as an additive with respect to 100 mol of the main component.

The resistance and the relative dielectric constant of each of the samples according to Examples 27 and 28 were obtained. As a result, a high resistance and a high relative dielectric constant could be obtained in both samples according to Examples 27 and 28.

From the results described above, it was confirmed that even when a dielectric film included the foregoing additive and the integrated intensity of the diffraction peak of the (111) plane was higher than the integrated intensity of the diffraction peak of the (100) plane in the X-ray diffraction chart related to the film thickness direction, the relative dielectric constant of the dielectric film was improved.

In order to confirm the relationship between the ratio of the additive included in the dielectric film and the resistance, the inventors prepared a plurality of samples having additives different from each other in the containing ratio and determined the resistance of each of the samples. In determination of the resistance, the resistance of 10,000 MΩ was adopted as a standard.

Figure 7:
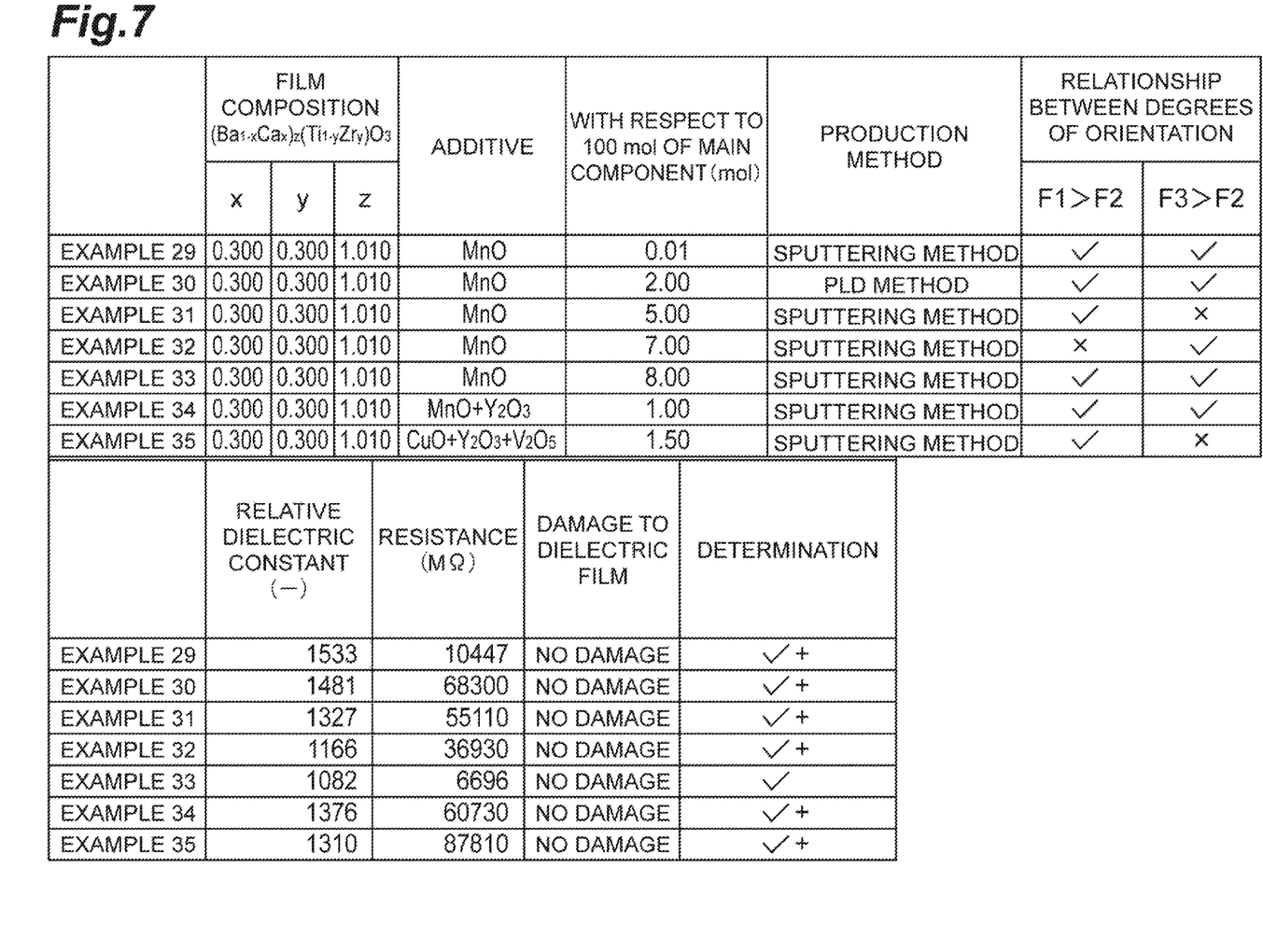
FIG. 7 is a table showing experimental results according to examples of the present disclosure.

The table of FIG. 7 shows the results. In the table of FIG. 7, the determination of the samples in which the resistance exceeded the foregoing standards was indicated with "✓+". Only the sample according to Example 30 of the samples according to Examples 29 to 35 shown in the table of FIG. 7 was formed as a film by a pulsed laser deposition method (PLD method), and the remaining samples were forming as films by a sputtering method. More specifically, the sample according to Example 30 was formed as a film by the PLD method using a pulsed laser with a pulse frequency of 1/10 Hz.

In the samples according to Examples 29 to 33, the amounts of MnO to be included as an additive with respect to 100 mol of the main component were set to 0.01 mol, 2.00 mol, 5.00 mol, 7.00 mol, and 8.00 mol, respectively. In the sample according to Example 34, the amounts of MnO and $Y_2O_3$ to be included as additives with respect to 100 mol of the main component were set to 1.00 mol. Moreover, in the sample according to Example 35, the amounts of CuO, $Y_2O_3$, and $V_2O_5$ to be included as additives with respect to 100 mol of the main component were set to 1.50 mol.

The resistance of each of the samples according to Examples 29 to 35 was obtained. As a result, a high resistance was obtained in all of the samples according to Examples 29 to 35. Particularly, an extremely high resistance could be obtained in the samples according to Examples 29 to 32, 34, and 35.

From the results described above, it was confirmed that when a dielectric film included BCTZ as a main component and included the foregoing additives within a range of 0.01 mol to 7.00 mol with respect to 100 mol of the main component, the resistance of the dielectric film was further improved.

All of the samples according to Examples 29 to 35 shown in the table of FIG. 7 included BCTZ as a main component and satisfied at least one of F1>F2 and F3>F2. Therefore, the determination of the resistance to a wet process was indicated with "no damage", and the resistance to a wet process was improved in all of the samples according to Examples 29 to 35.

Moreover, to check the resistance to a wet process of dielectric films constituted of metal oxides for which x=0 (that is, metal oxides including no Ca) in the composition $(Ba_{1-x}Ca_x)_z(Ti_{1-y}Zr_y)O_3$ of the main component BCTZ, the inventors prepared a plurality of samples having different main component BCTZ compositions and determined the resistance to a wet process of each sample.

Figure 8:
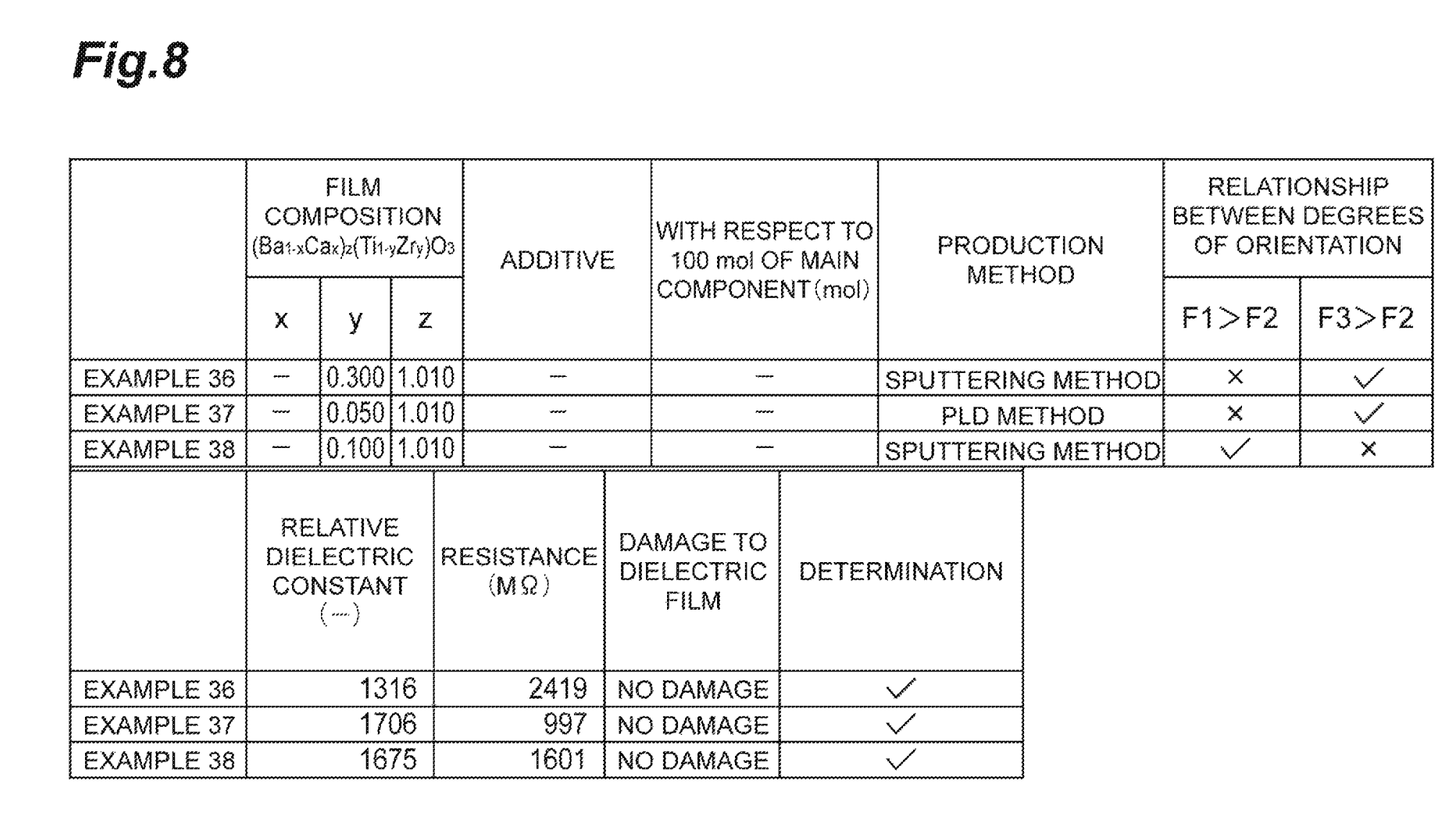

The table of FIG. 8 shows the results. The samples according to Examples 36 and 38 shown in the table of FIG. 8 were formed as a film by sputtering in an Ar gas atmosphere. The sample according to Example 37 was formed as a film by the PLD method using a pulsed laser of 1/10 Hz, and the formation rate thereof was reduced to 1/10 of the formation rate of Example 30.

Regarding the degree of orientation, both the samples according to Examples 36 and 37 satisfied only the relationship F3>F2 and the sample according to Example 38 satisfied only the relationship F1>F2. As the results of determination of the resistance to a wet process in the samples according to Examples 36 to 38, all of the samples according to Examples 36 to 38 were indicated with "no damage". It was also confirmed that these samples have properties to function sufficiently as capacitors.

From the results described above, it was confirmed that the resistance to a wet process was improved by appropriately selecting and adjusting the methods and conditions of film formation for a dielectric film including BCTZ including no Ca, as a main component. In the samples according to Examples 36 and 38, it is considered that the resistance to a wet process was improved as a result of situations being significantly reduced in which dielectric films were damaged by oxygen ions colliding against the dielectric films by sputtering in an Ar gas atmosphere containing no oxygen gas. In the sample according to Example 37, it is considered that the resistance to a wet process was improved as a result of denser dielectric films with no damages being obtained by relatively reducing the formation rate in the PLD method.

The film compositions of the samples according to Examples 36 to 38 satisfied all of $0 \leq x \leq 0.500$, $0.001 \leq y \leq 0.400$, and $0.995 < z < 1.040$, and both the relative dielectric constant and the resistance of the samples exceeded the standards (that is, the standard value (1000) of the relative dielectric constant and the standard value (100 MΩ) of the resistance). Thus it was also confirmed that the relative dielectric constant and the resistance were improved.

Figure 9A:
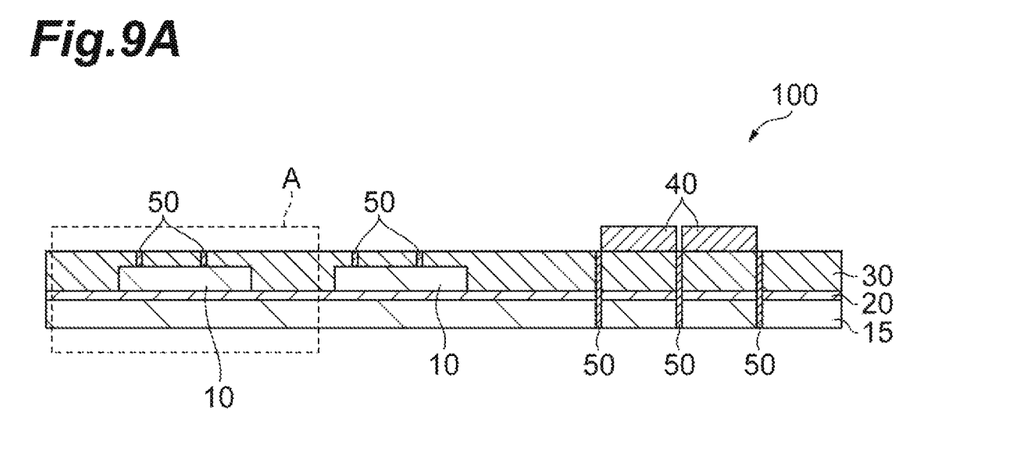
FIGS. 9A and 9B are schematic cross-sectional views showing an electronic circuit board according to an embodiment of the present disclosure.
Figure 9B:
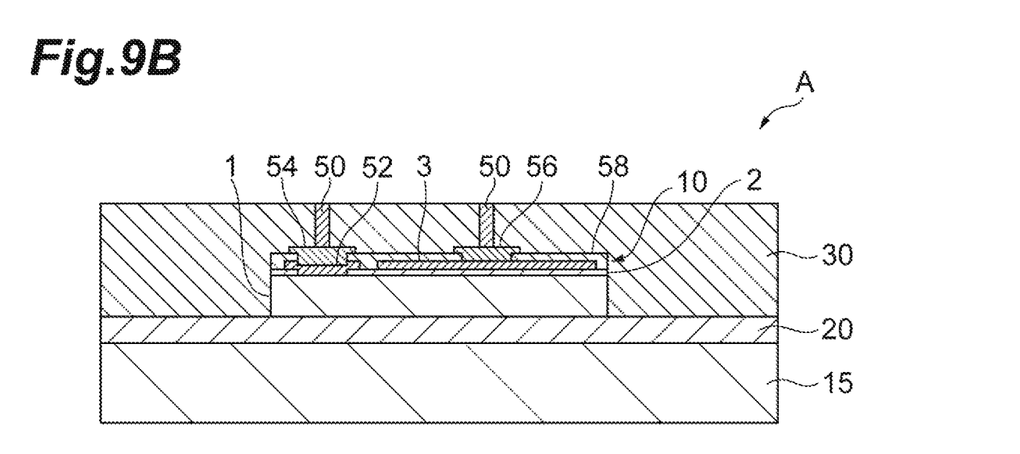

As illustrated in FIGS. 9A and 9B, an electronic circuit board 100 according to an embodiment of the present disclosure includes an epoxy-based resin substrate 15, a resin layer 20 formed on the epoxy-based resin substrate 15, thin-film capacitors 10 mounted on the resin layer 20, an insulating coating layer 30 formed on the resin layer 20 mounted with the thin-film capacitors 10, electronic components 40 placed on the insulating coating layer 30, and metal leads 50. At least a part of the metal leads 50 may be connected to extraction electrodes of the thin-film capacitors 10 or the electronic components 40. The metal leads 50 may be made of Cu or the like. At least a part of the metal leads 50 may be drawn to the surface of the epoxy-based resin substrate 15 or the insulating coating layer 30. At least a part of the metal leads 50 may penetrate through the electronic circuit board 100 in order to establish conduction between the upper and lower faces of the electronic circuit board 100. In this embodiment, the thin-film capacitors 10 are embedded within the electronic circuit board 100.

As illustrated in FIG. 9B, the thin-film capacitor 10 has a configuration in which the dielectric film 2 is interposed between the lower electrode 1 and the upper electrode 3. Specifically, each of the thin-film capacitors 10 according to an embodiment of the present disclosure includes the lower electrode 1, the dielectric film 2 provided on the lower electrode 1, the upper electrode 3 provided on a part of the dielectric film 2, a through electrode 52 provided directly on the surface of the lower electrode 1 with penetrating the other part of the dielectric film 2, an insulating resin layer 58 covering the upper electrode 3, the dielectric film 2, and the through electrode 52, an extraction electrode 54 provided directly on the surface of the through electrode 52 with penetrating the insulating resin layer 58, and an extraction electrode 56 provided directly on the surface of the upper electrode 3 with penetrating the insulating resin layer 58.

When manufacturing the electronic circuit board 100, an uncured resin layer which is a precursor of the resin layer 20 is formed on the epoxy-based resin substrate 15 at first. Subsequently, the thin-film capacitors 10 are mounted on the uncured resin layer such that the base electrode of each thin-film capacitor 10 and the uncured resin layer face each other. Then, the insulating coating layer 30 is formed on the uncured resin layer mounted with the thin-film capacitors 10, so that the thin-film capacitors 10 are held between the epoxy-based resin substrate 15 and the insulating coating layer 30. Thereafter, the uncured resin layer is thermally cured, so as to form the resin layer 30, while the epoxy-based resin substrate 15 and the insulating coating layer 30 are bonded together under pressure by thermal pressing. Next, through holes are formed, the metal leads 50 are formed within the through holes, and then the electronic components 40 are mounted on the insulating coating layer 30. This yields the electronic circuit board 100 within which the thin-film capacitors 10 are embedded. The uncured resin layer may be formed from a B-stage epoxy resin or the like which is uncured at room temperature but adapted to thermally cure upon heating. The insulating coating layer 30 may be formed from an epoxy-based resin, Teflon-based resin, polyimide-based resin, or the like, for example.

Hereinabove, the embodiment of the present disclosure has been described. However, the present disclosure is not limited to the foregoing embodiment, and various changes can be made. For example, the dielectric element is not limited to the thin-film capacitors described above, and an electrostatic capacitance thin-film sensor or the like is applicable. The electronic circuit board is not limited to the structure that the dielectric element is embedded therein as described above, the structure of the surface-mount package that the dielectric element is mounted on the substrate is applicable.

What is claimed is:

1. A dielectric film comprising:
   a metal oxide, as a main component, having a cubic structure expressed by a general formula Ba(Ti, Zr)$O_3$ and including both Ti and Zr components,
   wherein a relationship in a film thickness direction of both degree of orientation of (100) plane>degree of orientation of (110) plane and degree of orientation of (111) plane>degree of orientation of (110) plane is satisfied.

2. The dielectric film according to claim 1, wherein the metal oxide included as the main component is expressed by a general formula $Ba_z(Ti_{1-y}Zr_y)O_3$ and $0.001 \leq y \leq 0.400$, and $0.995 < z < 1.040$ are satisfied.

3. The dielectric film according to claim 1, wherein an integrated intensity of a diffraction peak of a (111) plane is higher than an integrated intensity of a diffraction peak of a (100) plane in an X-ray diffraction chart related to the film thickness direction.

4. The dielectric film according to claim 1, further comprising, at least one selected from the group consisting of Mn, Cu, Cr, Al, Ga, In, V, and a rare earth element as an additive.

5. The dielectric film according to claim 4, wherein the additive is included within a range of 0.01 mol to 7.00 mol with respect to 100 mol of the main component.

6. A dielectric element comprising:
   the dielectric film according to claim 1; and
   an electrode.

7. An electronic circuit board comprising the dielectric element according to claim 6.

* * * * *